United States Patent [19]
Choi

[11] Patent Number: 5,701,273
[45] Date of Patent: Dec. 23, 1997

[54] MEMORY DEVICE

[75] Inventor: Jae Myoung Choi, Ichon, Rep. of Korea

[73] Assignee: Hyundai Electronics Industries Co., Ltd., Rep. of Korea

[21] Appl. No.: 736,959

[22] Filed: Oct. 25, 1996

[30] Foreign Application Priority Data

Oct. 27, 1995 [KR] Rep. of Korea ............... 95-37694

[51] Int. Cl.$^6$ .................................................. G11C 8/00
[52] U.S. Cl. ................. 365/230.08; 365/193; 365/233.5
[58] Field of Search ........................ 365/230.06, 230.08, 365/193, 233.5

[56] References Cited

U.S. PATENT DOCUMENTS

| | | | |
|---|---|---|---|
| 5,233,565 | 8/1993 | Wang | 365/230.06 |
| 5,251,181 | 10/1993 | Toda | 365/230.08 |
| 5,293,347 | 3/1994 | Ogawa | 365/230.01 |
| 5,357,479 | 10/1994 | Matsui | 365/230.06 |
| 5,544,098 | 8/1996 | Matsuo et al. | 365/230.08 |
| 5,600,606 | 2/1997 | Rao | 365/230.08 |

*Primary Examiner*—Son T. Dinh
*Attorney, Agent, or Firm*—Gary M. Nath; Nath & Associates

[57] ABSTRACT

A memory device comprising a cell array including first and second cell array blocks for storing data therein, an address buffer for generating an internal column address signal in response to an external column address signal and an internal column address strobe signal, a pre-decoder for pre-decoding the internal column address signal from the address buffer, a first latch circuit for generating a first internal column address signal in response to the pre-decoded internal column address signal from the pre-decoder and a first column address strobe signal, a second latch circuit for generating a second internal column address signal in response to the pre-decoded internal column address signal from the pre-decoder and a second column address strobe signal, a first column decoder for selectively driving bit lines to the first cell array block in response to the first internal column address signal from the first latch circuit to transfer external data to the first cell array block or to transfer data from the first cell array block externally, and a second column decoder for selectively driving bit lines to the second cell array block in response to the second internal column address signal from the second latch circuit to transfer external data to the second cell array block or to transfer data from the second cell array block externally.

6 Claims, 6 Drawing Sheets

MEMORY DEVICE

BACKGROUND OF THE INVENTION

1. Field of the Invention

The present invention relates in general to memory devices, and more particularly to a memory device having a pipelined page mode for performing successive data input/output operations in response to successive column addresses.

2. Description of the Prior Art

Referring to FIG. 1, the construction of a conventional memory device is shown in block form. As shown in this drawing, the conventional memory device comprises an address buffer 14 for receiving a column address, and a pre-decoder 13 for pre-decoding the column address received by the address buffer 14 and outputting the pre-decoded column address to column decoders 121 and 122 to select a desired column line. As a result, data is read or written from or into a cell connected to the selected column line.

FIG. 2 is a timing diagram illustrating the operation of the conventional memory device in FIG. 1. As shown in this drawing, an internal column address strobe signal CAS is generated when a column address strobe bar signal /CAS is toggled from high to low in logic under the condition that a row address strobe bar signal /RAS makes a high to low transition in logic. As a result, a desired column address is received from the outside.

However, the above-mentioned conventional memory device has a very long access time in a page mode because a precharge time tCP and an active time tCAS of the column address strobe bar signal /CAS are required for each cycle in which one column address is received. For this reason, the conventional memory device is limited in high-speed operation.

SUMMARY OF THE INVENTION

Therefore, the present invention has been made in view of the above problem, and it is an object of the present invention to provide a memory device having a pipelined page mode in which column addresses are received at both high and low logic states of a column address strobe bar signal and then selected by column decoders, so that successive data input/output operations can be performed to make the high-speed operation possible.

In accordance with the present invention, the above and other objects can be accomplished by a provision of a memory device comprising a cell array including first and second cell array blocks for storing data therein; control means for generating an internal column address strobe signal, a first column address strobe signal and a second column address strobe signal in response to a row address strobe bar signal, an external column address strobe bar signal, a write enable signal and an output enable signal; an address buffer for generating an internal column address signal in response to an external column address signal and the internal column address strobe signal from the control means; a pre-decoder for pre-decoding the internal column address signal from the address buffer; first latch means for generating a first internal column address signal in response to the pre-decoded internal column address signal from the pre-decoder and the first column address strobe signal from the control means; second latch means for generating a second internal column address signal in response to the pre-decoded internal column address signal from the pre-decoder and the second column address strobe signal from the control means; a first column decoder for selectively driving bit lines to the first cell array block in response to the first internal column address signal from the first latch means to transfer external data to the first cell array block or transfer data from the first cell array block externally; and a second column decoder for selectively driving bit lines to the second cell array block in response to the second internal column address signal from the second latch means to transfer external data to the second cell array block or transfer data from the second cell array block externally.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
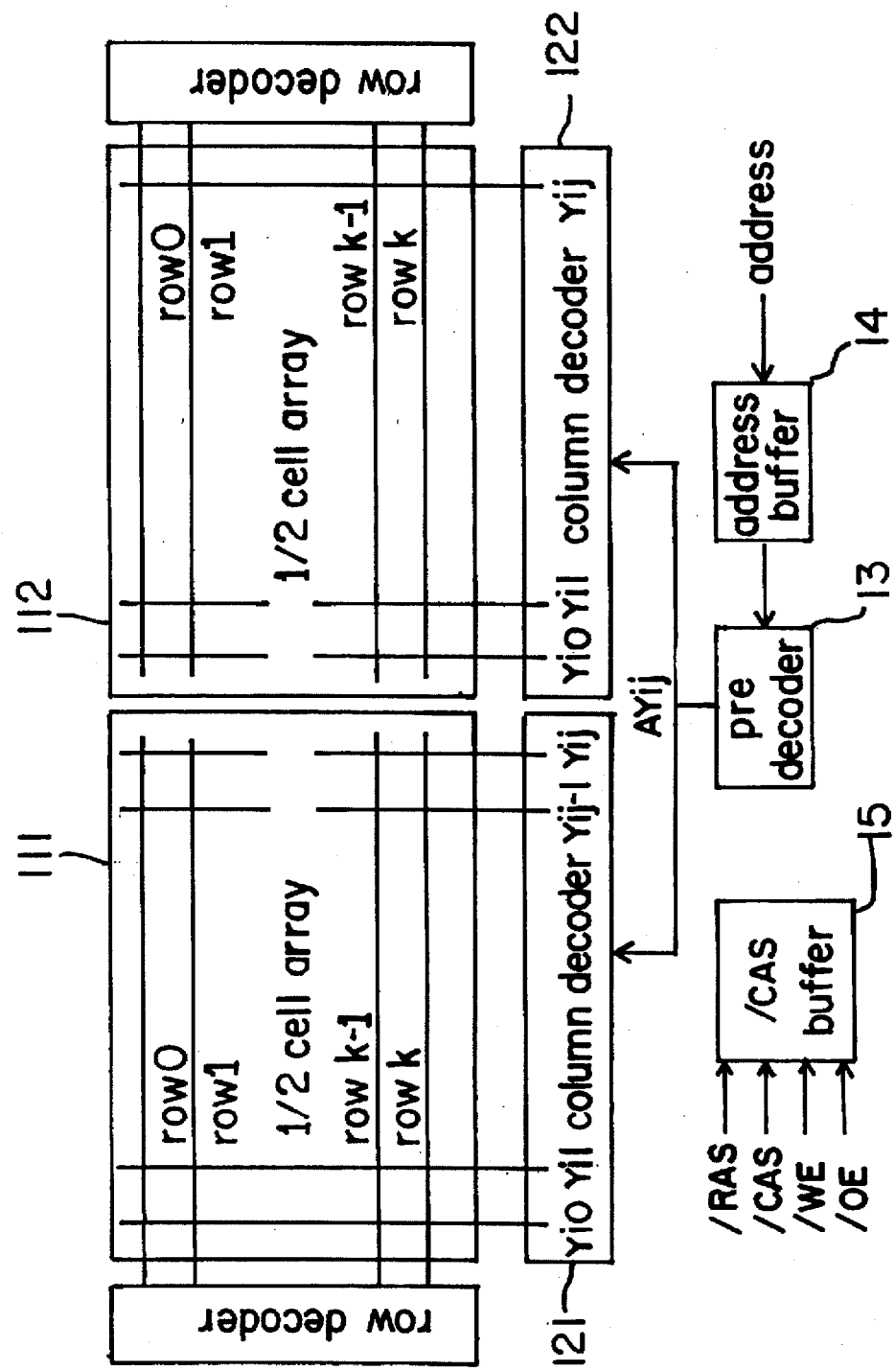
FIG. 1 is a block diagram illustrating the construction of a conventional memory device.
Figure 2:
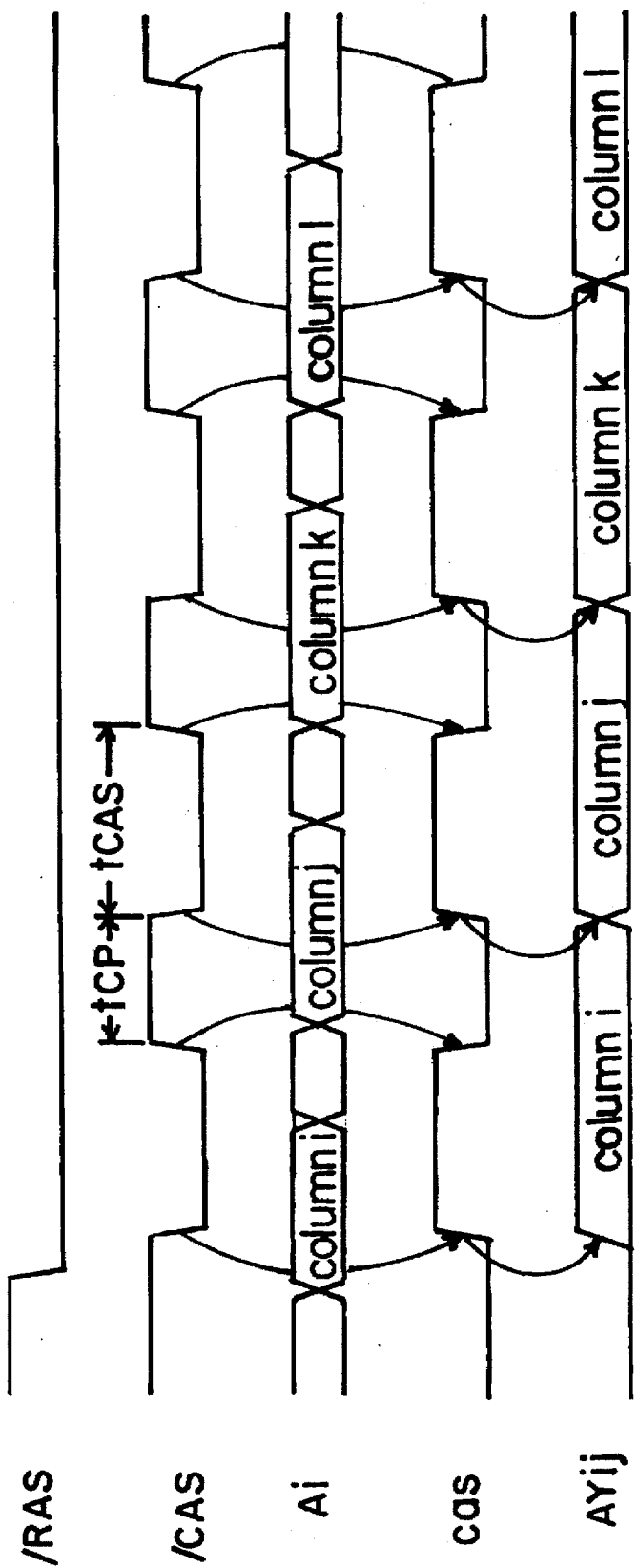
FIG. 2 is a timing diagram illustrating the operation of the conventional memory device in FIG. 1.
Figure 3:
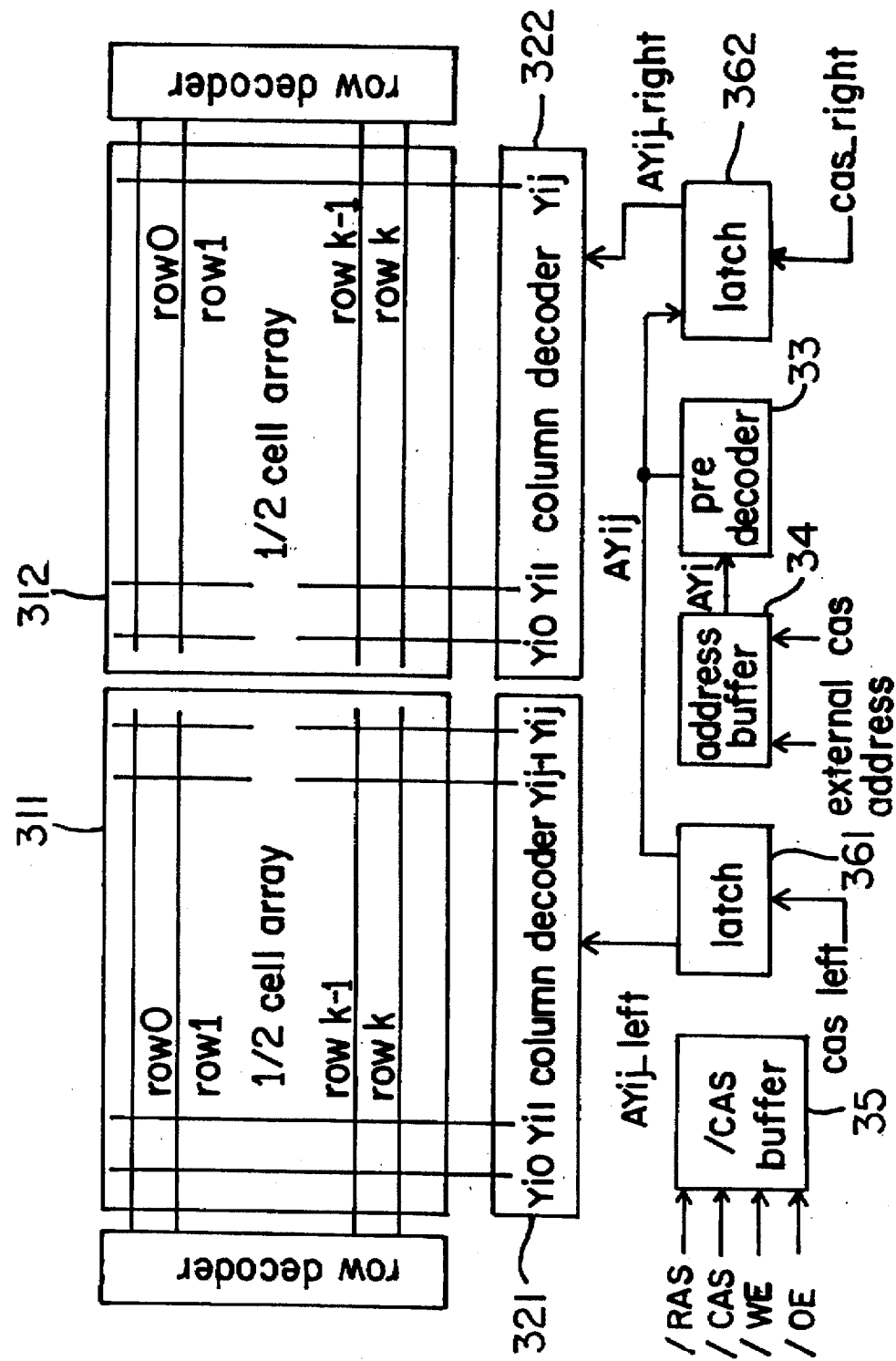
FIG. 3 is a block diagram illustrating the construction of a memory device in accordance with an embodiment of the present invention.

Referring to FIG. 3, the construction of a memory device in accordance with an embodiment of the present invention is shown in block form. As shown in this drawing, the memory device comprises a cell array including left and right cell array blocks 311 and 312 for storing data therein, and a column address strobe bar buffer (referred to hereinafter as /CAS buffer) 35 for generating an internal column address strobe signal cas, a left column address strobe signal cas_left and a right column address strobe signal cas_right in response to a row address strobe bar signal /RAS, an external column address strobe bar signal /CAS, a write enable signal /WE and an output enable signal /OE.

The memory device further comprises an address buffer 34 for generating an internal column address signal AYi in response to an external column address signal and the internal column address strobe signal cas from the /CAS buffer 35, a pre-decoder 33 for pre-decoding the internal column address signal AYi from the address buffer 34, a left latch circuit 361 for generating a left internal column address signal AYij_left in response to the pre-decoded internal column address signal AYij from the pre-decoder 33 and the left column address strobe signal cas_left from the /CAS buffer 35, and a right latch circuit 362 for generating a right internal column address signal AYij_right in response to the pre-decoded internal column address signal AYij from the pre-decoder 33 and the right column address strobe signal cas_right from the /CAS buffer 35.

The memory device further comprises a left column decoder 321 for selectively driving bit lines to the left cell array block 311 in response to the left internal column address signal AYij_left from the left latch circuit 361 to transfer external data to the left cell array block 311 or transfer data from the left cell array block 311 externally, and a right column decoder 322 for selectively driving bit lines to the right cell array block 312 in response to the right internal column address signal AYij_right from the right latch circuit 362 to transfer external data to the right cell array block 312 or transfer data from the right cell array block 312 externally.

The operation of the memory device with the above-mentioned construction in accordance with the preferred embodiment of the present invention will hereinafter be described in detail.

If the external column address signal is applied to the address buffer 34, the external column address strobe bar signal /CAS is applied to the /CAS buffer 35. Upon receiving the external column address strobe bar signal /CAS, the /CAS buffer 35 generates the internal column address strobe signal cas, the left column address strobe signal cas_left and the right column address strobe signal cas_right. Then, the /CAS buffer 35 outputs the internal column address strobe signal cas, the left column address strobe signal cas_left and the right column address strobe signal cas_right to the address buffer 34 and the left and right latch circuits 361 and 362, respectively. At this time, if the external column address strobe bar signal /CAS is high in logic, the left column address strobe signal cas_left is high in logic and the right column address strobe signal cas_right is low in logic. In contrast, if the external column address strobe bar signal /CAS is low in logic, the left column address strobe signal cas_left is low in logic and the right column address strobe signal cas_right is high in logic.

In response to the internal column address strobe signal cas from the /CAS buffer 35, the address buffer 34 converts the external column address signal into the internal column address signal AYi, which is then pre-decoded by the pre-decoder 33. The pre-decoder 33 outputs the pre-decoded internal column address signal AYij to the left and right latch circuits 361 and 362.

The left latch circuit 361 generates the left internal column address signal AYij_left in response to the pre-decoded internal column address signal AYij from the pre-decoder 33 and the left column address strobe signal cas_left from the /CAS buffer 35. Then, the left latch circuit 361 outputs the left internal column address signal AYij_left to the left column decoder 321 connected to the left cell array block 311. The right latch circuit 362 generates the right internal column address signal AYij_right in response to the pre-decoded internal column address signal AYij from the pre-decoder 33 and the right column address strobe signal cas_right from the /CAS buffer 35. Then, the right latch circuit 362 outputs the right internal column address signal AYij_right to the right column decoder 322 connected to the right cell array block 312.

At this time, if the external column address strobe bar signal /CAS is low in logic, the left column address strobe signal cas_left is made active high in logic to generate the left internal column address signal AYij_left. As a result, the left column decoder 321 is operated in response to the left internal column address signal AYij_left to select the corresponding bit line to the left cell array block 311 for the data input and output.

In contrast, in the case where the external column address strobe bar signal /CAS is high in logic, the right column address strobe signal cas_right is made active high in logic to generate the right internal column address signal AYij_right. As a result, the right column decoder 322 is operated in response to the right internal column address signal AYij_right to select the corresponding bit line to the right cell array block 312 for the data input and output.

In this manner, the data input/output operation can be performed with respect to the entire cell array by controlling the frequency of the external column address strobe bar signal /CAS.

Figure 4:
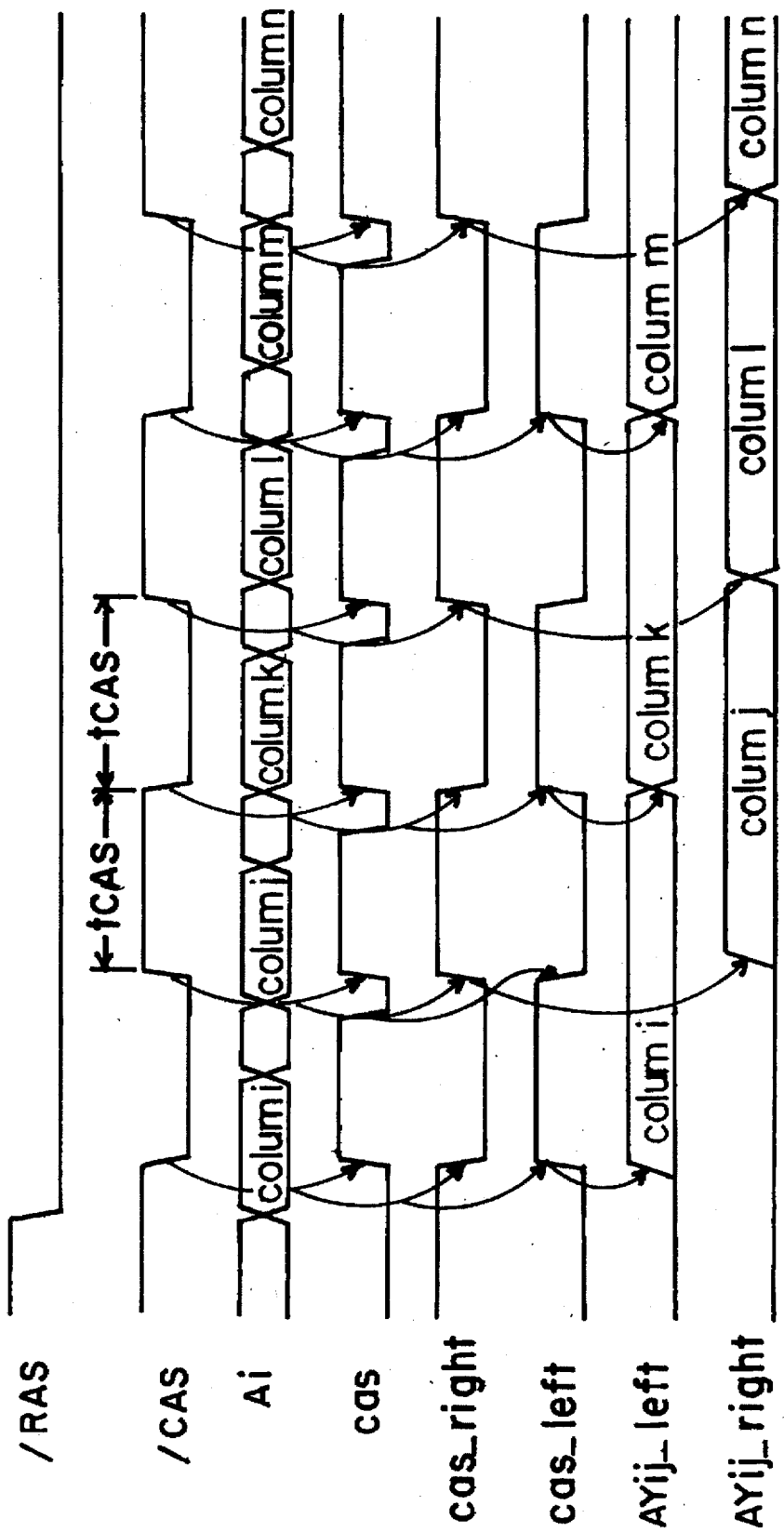
FIG. 4 is a timing diagram illustrating the operation of the memory device in FIG. 3.

FIG. 4 is a timing diagram illustrating the operation of the memory device in FIG. 3. As shown in this drawing, the left and right internal column address signals AYij_left and AYij_right are alternately generated for each cycle of the external column address strobe bar signal /CAS to alternately select the left and right cell array blocks 311 and 312. Therefore, the data input/output operation can be performed with respect to the entire cell array.

Figure 5:
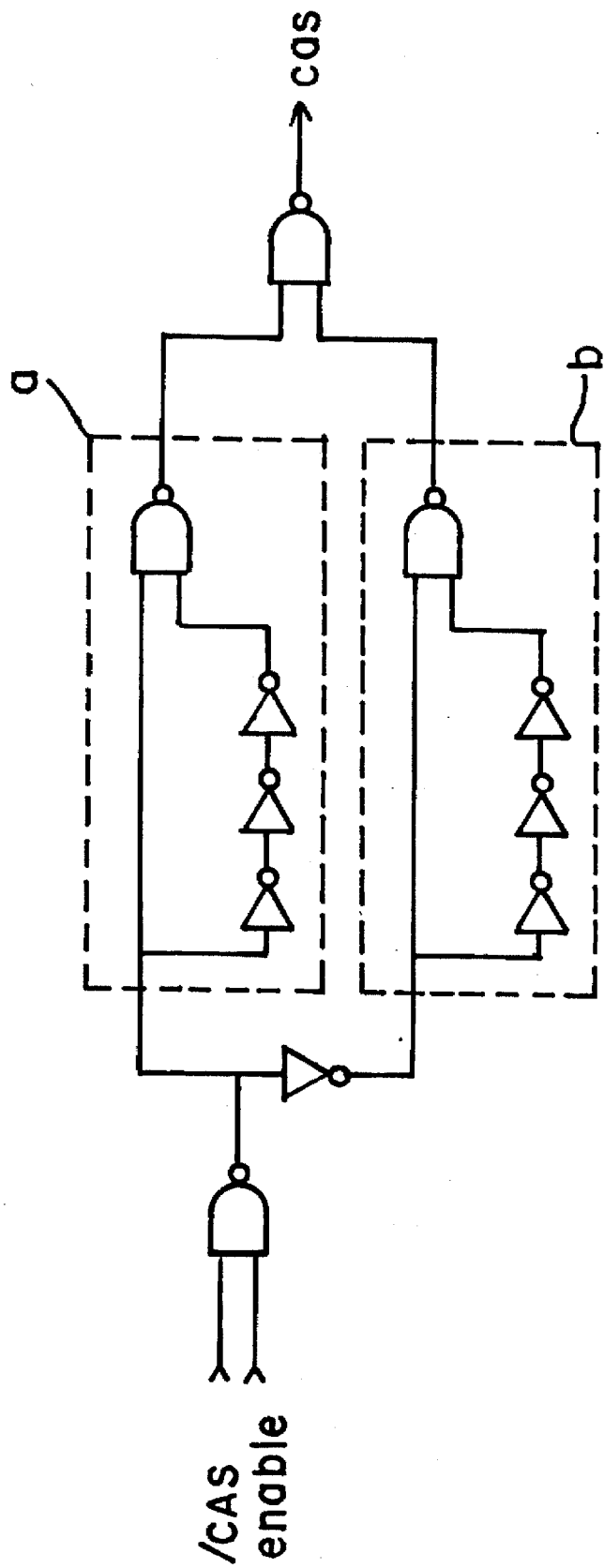
FIG. 5 is a circuit diagram of an internal column address strobe signal generator in a column address strobe bar buffer in FIG. 3.

FIG. 5 is a circuit diagram of an internal column address strobe signal generator in the /CAS buffer 35 in FIG. 3. When the external column address strobe bar signal /CAS makes a high to low transition in logic, the internal column address strobe signal cas is generated along a path a. To the contrary, in the case where the external column address strobe bar signal /CAS makes a low to high transition in logic, the internal column address strobe signal cas is generated along a path b. In other words, the internal column address strobe signal cas is generated whenever the external column address strobe bar signal /CAS makes a transition in logic.

Figure 6:
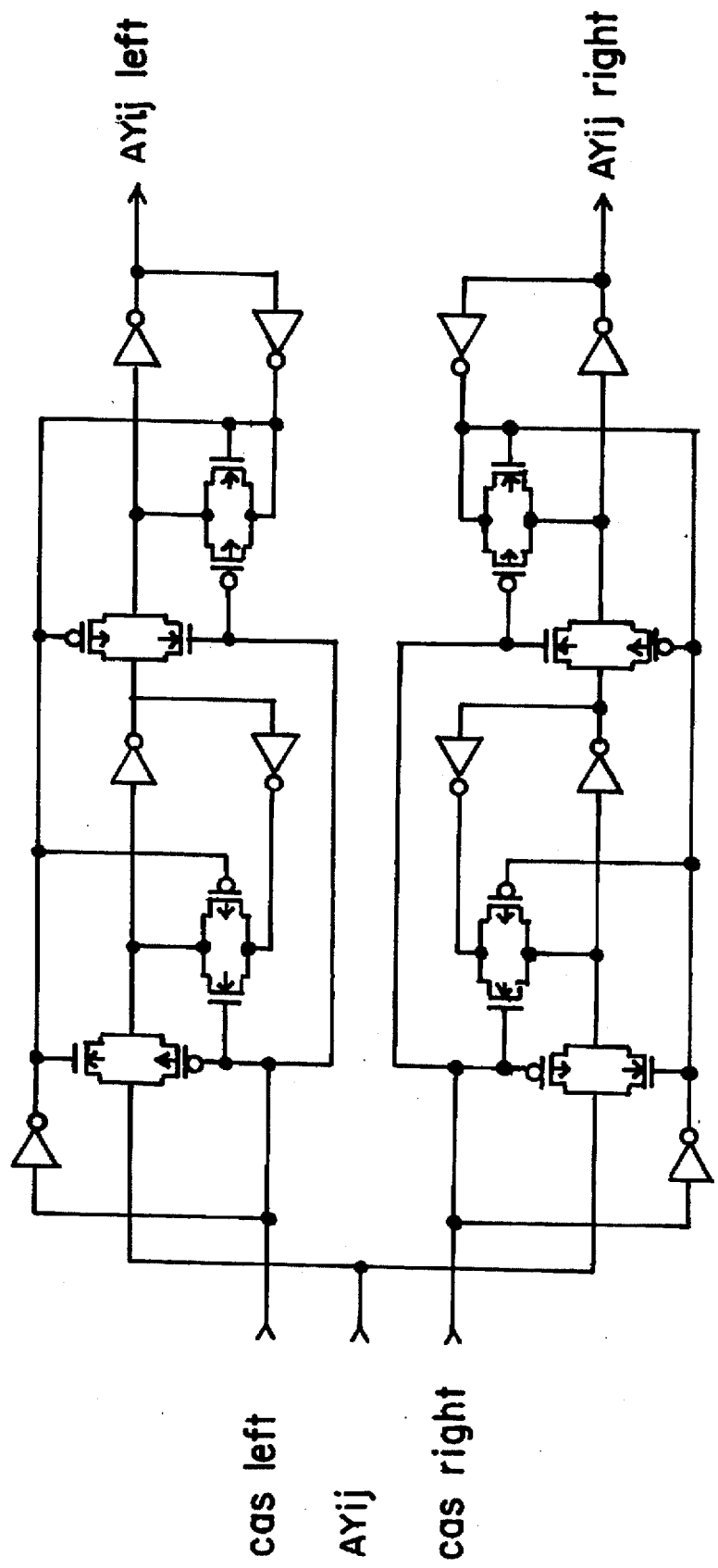
FIG. 6 is a circuit diagram of left and right latch circuits in FIG. 3.

FIG. 6 is a circuit diagram of the left and right latch circuits 361 and 362 in FIG. 3. As shown in this drawing, the left latch circuit 361 is constructed to generate the left internal column address signal AYij_left in response to the pre-decoded internal column address signal AYij from the pre-decoder 33 and the left column address strobe signal cas_left from the /CAS buffer 35. Also, the right latch circuit 362 is adapted to generate the right internal column address signal AYij_right in response to the pre-decoded internal column address signal AYij from the pre-decoder 33 and the right column address strobe signal cas_right from the /CAS buffer 35. In other words, when the left column address strobe signal cas_left from the /CAS buffer 35 makes a high to low transition in logic, the left latch circuit 361 receives the pre-decoded internal column address signal AYij from the pre-decoder 33. Then, when the left column address strobe signal cas_left from the /CAS buffer 35 makes a low to high transition in logic, the left latch circuit 361 generates the left internal column address signal AYij_left. Similarly, when the right column address strobe signal cas_right from the /CAS buffer 35 makes a high to low transition in logic, the right latch circuit 362 receives the pre-decoded internal column address signal AYij from the pre-decoder 33. Then, when the right column address strobe signal cas_right from the /CAS buffer 35 makes a low to high transition in logic, the right latch circuit 362 generates the right internal column address signal AYij_right.

In this manner, whenever the external column address strobe bar signal /CAS is toggled in logic, the left and right internal column address signals AYij_left and AYij_right are alternately generated in response to the external column address signal to alternately select the left and right cell array blocks 311 and 312. Therefore, the successive data input/output operations can be performed to make the high-speed operation possible.

As is apparent from the above description, according to the present invention, a new column address is selected whenever the external column address strobe bar signal is toggled in logic. Therefore, the successive data input/output operations can be performed to make the high-speed operation possible.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device comprising:

first and second arrays of memory cells, each array having a plurality of columns and a plurality of rows;

an address buffer having a plurality of inputs coupled to receive external address information;

a predecoder having a plurality of inputs coupled to a respective plurality of outputs of said address buffer;

a first latch and a second latch each having an input coupled to an output of said predecoder;

first and second column decoders having outputs respectively coupled to said first and second arrays of memory cells for driving said plurality of columns, and inputs respectively coupled to outputs of said first and second latch; and a CAS buffer for generating internal column address strobe (cas) signals consisting of first and second internal cas signals in response to an external CAS signal;

wherein the address buffer receives the internal cas signals consisting of first and second internal cas signals, and said first and said second latches respectively receive the first and second internal cas signals to alteratively address each of the memory arrays to eliminate a predetermined precharge time of the external CAS signal.

2. A memory device as set forth in claim 1, wherein said first and second internal cas signals are generated respectively in response to each rising and falling edge of the external CAS signals.

3. A memory device as set forth in claim 1, wherein said first latch generates a first internal column address signal in response to the pre-decoded internal column address signal from said pre-decoder and the first internal cas signal.

4. A memory device as set forth in claim 1, wherein said second latch generates a second internal column address signal in response to the pre-decoded internal column address signal from said pre-decoder and the second internal cas signal.

5. A memory device as set forth in claim 1, wherein said first latch is adapted to receive the pre-decoded internal column address signal from said pre-decoder when the first cas signal makes a high to low transition in logic, and to generate the first internal column address signal when the first cas signal makes a low to high transition in logic.

6. A memory device as set forth in claim 1, wherein said second latch is adapted to receive the pre-decoded internal column address signal from said pre-decoder when the second cas signal makes a high to low transition in logic, and to generate the second internal column address signal when the second cas signal makes a low to high transition in logic.

* * * * *